US007606101B2

(12) United States Patent  (10) Patent No.: US 7,606,101 B2
Schoenfeld et al.  (45) Date of Patent: Oct. 20, 2009

(54) CIRCUIT AND METHOD FOR CONTROLLING A CLOCK SYNCHRONIZING CIRCUIT FOR LOW POWER REFRESH OPERATION

(75) Inventors: Aaron M. Schoenfeld, Boise, ID (US); Ross E. Dermott, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 377 days.

(21) Appl. No.: 11/506,238

(22) Filed: Aug. 17, 2006

(65) Prior Publication Data

US 2006/0274592 A1  Dec. 7, 2006

Related U.S. Application Data

(63) Continuation of application No. 11/184,187, filed on Jul. 18, 2005, now Pat. No. 7,106,646, which is a continuation of application No. 10/684,123, filed on Oct. 9, 2003, now Pat. No. 6,975,556.

(51) Int. Cl.
*G11C 7/00* (2006.01)
(52) U.S. Cl. ...................................... 365/222; 365/227
(58) Field of Classification Search ................. 365/222, 365/227, 233
See application file for complete search history.

(56) References Cited

U.S. PATENT DOCUMENTS

| 5,708,611 | A | | 1/1998 | Iwamoto et al. ............. 365/195 |
| 5,949,733 | A | * | 9/1999 | Kotani et al. ........... 365/230.03 |
| 5,987,244 | A | | 11/1999 | Kau et al. .................... 395/555 |
| 6,208,577 | B1 | | 3/2001 | Mullarkey ................... 365/222 |
| 6,438,055 | B1 | * | 8/2002 | Taguchi et al. .............. 365/222 |
| 6,525,988 | B2 | | 2/2003 | Ryu et al. .................... 365/233 |
| 6,728,157 | B2 | | 4/2004 | Yagishita et al. ............ 365/222 |
| 6,826,106 | B2 | | 11/2004 | Chen .......................... 365/222 |
| 2001/0028589 | A1 | | 10/2001 | Cho et al. ................... 365/222 |

FOREIGN PATENT DOCUMENTS

JP  2000 030438  1/2000

\* cited by examiner

*Primary Examiner*—Son Dinh
(74) *Attorney, Agent, or Firm*—Dorsey & Whitney LLP

(57) ABSTRACT

A method and apparatus is provided for idling a clock synchronizing circuit during at least a portion of time during execution of a refresh operation in a memory device. In a memory device receiving an external clock signal, a method and apparatus for executing a refresh operation is provided that includes initiating at least one refresh operation in the memory device, and ceasing generation of an internal clock signal timed with respect to the external clock signal for at least a portion of the time in which at least one refresh operation takes to complete.

17 Claims, 4 Drawing Sheets

CIRCUIT AND METHOD FOR CONTROLLING A CLOCK SYNCHRONIZING CIRCUIT FOR LOW POWER REFRESH OPERATION

CROSS-REFERENCE TO RELATED APPLICATIONS

This application is a continuation of pending U.S. patent application Ser. No. 11/184,187, filed Jul. 18, 2005, which is a continuation of U.S. patent application Ser. No. 10/684,123, filed Oct. 9, 2003, issued Dec. 13, 2005 as U.S. Pat. No. 6,975,556 B2.

TECHNICAL FIELD

The present invention relates generally to synchronous integrated circuits, and more specifically, to a control circuit for idling a synchronizing circuit during a refresh operation, such as in a synchronous dynamic random access memory device.

BACKGROUND OF THE INVENTION

In synchronous integrated circuits, the integrated circuit is clocked by an external clock signal and performs operations at predetermined times relative the rising and falling edges of the applied clock signal. Examples of synchronous integrated circuits include synchronous memory devices such as synchronous dynamic random access memories (SDRAMs), synchronous static random access memories (SSRAMs), and packetized memories like SLDRAMs and RDRAMs, and include other types of integrated circuits as well, such as microprocessors. In SDRAM devices, the memory core typically consists of an array of volatile dynamic random access memory (DRAM) cells. As well known in the art, DRAM cells are volatile because of the manner in which data is stored, namely, as the presence or absence of charge across a capacitor. Due to leakage currents inherent in the design of semiconductor DRAM cells, the capacitor can maintain its charge for only a finite time. As a result, the DRAM cells must be periodically "refreshed" in order to maintain the respective data states. The mechanism by which the memory cells of DRAM and SDRAM devices are refreshed is well known in the art.

With specific reference to SDRAM devices, the timing of signals external to a synchronous memory device is determined by the external clock signal, and operations within the memory device typically must be synchronized to external operations. The timing of signals external to a synchronous memory device is determined by the external clock signal, and operations within the memory device typically must be synchronized to external operations. For example, data are placed on a data bus by the memory device in synchronism with the external clock signal, and consequently, the memory device must provide the data to the bus at the proper times. To provide the data at the correct times, an internal clock signal is developed in response to the external clock signal, and is typically applied to latches contained in the memory device to thereby clock the data onto the data bus. The internal clock signal and external clock must be synchronized to ensure the internal clock signal clocks the latches at the proper times to successfully output the data at the proper times.

As used herein, the term synchronized includes signals that are coincident and signals that have a desired delay relative to one another. Additionally, in the present description, "external" is used to refer to signals and operations outside of the memory device, and "internal" to refer to signals and operations within the memory device. Moreover, although the present description is directed to synchronous memory devices, the principles described herein are equally applicable to other types of synchronous integrated circuits.

To synchronize external and internal clock signals in modern synchronous memory devices, a number of different approaches have been considered and utilized, including using clock synchronizing circuits that can generate an output clock signal synchronized with an input clock signal. Examples of conventional clock synchronizing circuits include delay-locked loops (DLLs), phased-locked loops (PLLs), and synchronous mirror delays (SMDs), as will be appreciated by those skilled in the art. As well known, conventional clock synchronizing circuits typically include a variable delay line that is used in generating a synchronized output clock signal. For example, in conventional DLLs, the variable delay line is part of a timing feedback loop. The phase difference between the input and output clock signals are compared, and a control signal indicative of the phase difference is generated. The control signal can then be used to incrementally adjust the variable delay line until the delay results in a synchronized output clock signal. When the appropriate delay time is achieved, the DLL is said to be "locked." Even after the DLL is locked, the DLL constantly monitors for changes that affect the synchronization between the input and output clock signals, such as voltage variations, changes in operating temperature, and the like, and adjust the time delay accordingly in order to keep the synchronized output clock signal from excessively drifting out of synchronization.

The variable delay line is often formed from a number of serially-connected individual delay stages, with individual delay stages being added or removed to adjust the variable delay, as will be understood by those skilled in the art. For example, a plurality of serially-connected delay stages could be used to form the variable delay line, with one of the inputs of the different delay stages being selected as the entry point for the input clock signal in response to a control signal in order to control the length of the variable delay. A large number of stages in the variable delay line is desirable because each stage can have an incremental delay, which can provide better resolution in controlling the value of the variable delay. In addition, as well known, the lowest input clock frequency at which the DLL can operate is limited by the maximum variable delay that can be provided by the variable delay line.

The desired fine resolution and maximum variable delay that the variable delay line must provide can result in significant power consumption by the synchronizing clock circuit, which may be undesirable particularly where the memory device is used in a low-power application. For example, when the synchronous memory device is contained in a portable battery-powered device. One reason for greater power consumption when using more delay stages is the manner in which the input clock signal is applied to the delay stages of the variable delay line. As well known, each of the delay stages typically receives the input clock signal, and the delay time is adjusted by selecting the entry point of the input clock signal to the chain of delay stages. The input clock signal then propagates through the delay stages until being output by the last delay stage in the chain. It will be appreciated that the entry point may be in the "middle" of the chain of delay stages. Although the "upstream" delay stages are not used in synchronizing the output clock signal, they nevertheless are clocked by the input clock signal, causing the toggling of logic gates in each delay stage. The resulting switching current is wasted, since as previously discussed, the upstream delay stages are not utilized in generating the synchronized output clock signal. Additionally, the circuitry that is driven by the synchronized output clock signal, such as in the previously described case with synchronizing output data by clocking latches with the synchronized clock signal, will continue to consume power as the synchronized output clock signal transitions due to switching currents in the output circuitry.

SUMMARY OF THE INVENTION

In one aspect of the invention a volatile memory device includes a clock controller that controls a clock circuit to idle for at least a portion of time during which memory cells of a memory-cell array are refreshed. In another aspect of the invention a memory device includes a refresh circuit, a synchronizing clock circuit and a synchronizing clock control circuit. The refresh circuit is coupled to a memory-cell array and a control circuit of the memory device. The refresh circuit is operable to perform a refresh operation for memory cells of the memory-cell array in response to a refresh command signal provided by the control circuit. The refresh operation has a refresh time period during which the refresh operation is completed. The synchronizing clock circuit is coupled to the control circuit and is operable to generate an internal clock signal timed with respect to an input clock signal. The synchronizing clock control circuit is coupled to the synchronizing clock circuit and the control circuit. The synchronizing clock control circuit is operable to control the synchronizing clock circuit to cease generating the internal clock signal for at least a portion of the refresh time period for a refresh operation.

DETAILED DESCRIPTION OF THE INVENTION

Figure 1:
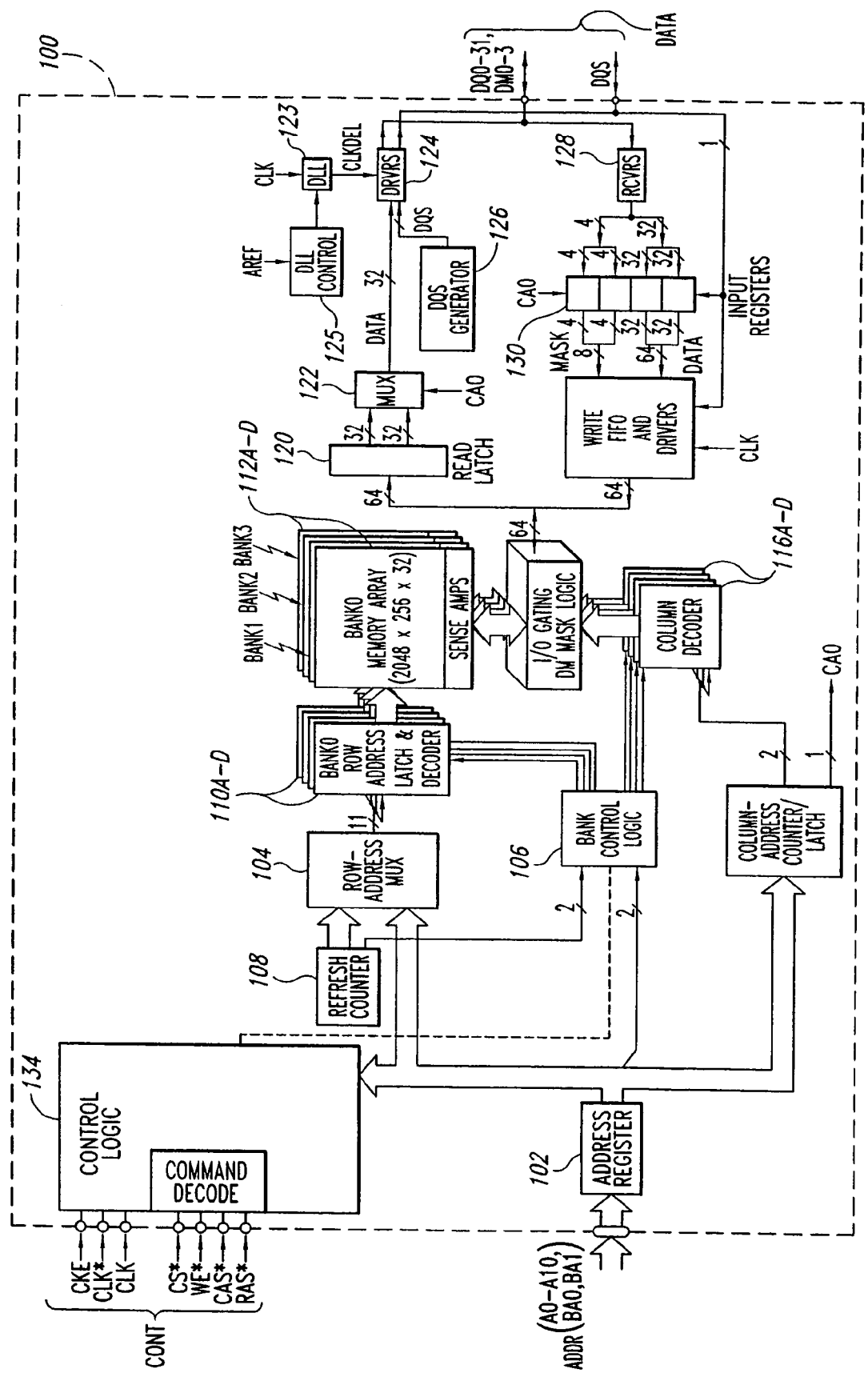
FIG. 1 is a functional block diagram of a synchronous memory device in which embodiments of the present invention can be utilized.

FIG. 1 is a functional block diagram of a memory device 100 in which embodiments of the present invention can be implemented. Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention. The memory device 100 in FIG. 1 is a double-data rate (DDR) synchronous dynamic random access memory ("SDRAM"), although the principles described herein are applicable to any memory device that may include a synchronizing circuit for synchronizing internal and external signals, such as conventional synchronous DRAMs (SDRAMs), as well as packetized memory devices like SLDRAMs and RDRAMs, and are equally applicable to any integrated circuit that must synchronize internal and external clocking signals.

The memory device 100 includes a control logic and command decoder 134 that receives a plurality of command and clocking signals over a control bus CONT, typically from an external circuit such as a memory controller (not shown). The command signals typically include a chip select signal CS*, a write enable signal WE*, a column address strobe signal CAS*, and a row address strobe signal RAS*, while the clocking signals include a clock enable signal CKE and complementary clock signals CLK, CLK*, with the "*" designating a signal as being active low. The command signals CS*, WE*, CAS*, and RAS* are driven to values corresponding to a particular command, such as a read, write, or auto-refresh command. The CKE signal is used to activate and deactivate the internal clock, input buffers and output drivers. In response to the clock signals CLK, CLK*, the command decoder 134 latches and decodes an applied command, and generates a sequence of clocking and control signals that control the components 102-132 to execute the function of the applied command. The command decoder 134 latches command and address signals at positive edges of the CLK, CLK* signals (i.e., the crossing point of CLK going high and CLK* going low), while the input registers 130 and data drivers 124 transfer data into and from, respectively, the memory device 100 in response to both edges of the data strobe signal DQS and thus at double the frequency of the clock signals CLK, CLK*. This is true because the DQS signal has the same frequency as the CLK, CLK* signals. The memory device 100 is referred to as a double-data-rate device because the data words DQ being transferred to and from the device are transferred at double the rate of a conventional SDRAM, which transfers data at a rate corresponding to the frequency of the applied clock signal. The detailed operation of the control logic and command decoder 134 in generating the control and timing signals is conventional, and thus, for the sake of brevity, will not be described in more detail.

Further included in the memory device 100 is an address register 102 that receives row, column, and bank addresses over an address bus ADDR, with a memory controller (not shown) typically supplying the addresses. The address register 102 receives a row address and a bank address that are applied to a row address multiplexer 104 and bank control logic circuit 106, respectively. The row address multiplexer 104 applies either the row address received from the address register 102 or a refresh row address from a refresh counter 108 to a plurality of row address latch and decoders 110A-D. The bank control logic 106 activates the row address latch and decoder 110A-D corresponding to either the bank address received from the address register 102 or a refresh bank address from the refresh counter 108, and the activated row address latch and decoder latches and decodes the received row address. In response to the decoded row address, the activated row address latch and decoder 110A-D applies various signals to a corresponding memory bank 112A-D to thereby activate a row of memory cells corresponding to the decoded row address. Each memory bank 112A-D includes a memory-cell array having a plurality of memory cells arranged in rows and columns, and the data stored in the memory cells in the activated row is stored in sense amplifiers in the corresponding memory bank. The row address multiplexer 104 applies the refresh row address from the refresh counter 108 to the decoders 110A-D and the bank control logic circuit 106 uses the refresh bank address from the refresh counter when the memory device 100 operates in an auto-refresh or self-refresh mode of operation in response to an auto- or self-refresh command being applied to the memory device 100, as will be appreciated by those skilled in the art.

A column address is applied on the ADDR bus after the row and bank addresses, and the address register 102 applies the column address to a column address counter and latch 114 which, in turn, latches the column address and applies the latched column address to a plurality of column decoders 116A-D. The bank control logic 106 activates the column decoder 116A-D corresponding to the received bank address, and the activated column decoder decodes the applied column address. Depending on the operating mode of the memory device 100, the column address counter and latch 114 either directly applies the latched column address to the decoders 116A-D, or applies a sequence of column addresses to the decoders starting at the column address provided by the address register 102. In response to the column address from the counter and latch 114, the activated column decoder 116A-D applies decode and control signals to an I/O gating and data masking circuit 118 which, in turn, accesses memory cells corresponding to the decoded column address in the activated row of memory cells in the memory bank 112A-D being accessed.

During data read operations, data being read from the addressed memory cells is coupled through the I/O gating and data masking circuit 118 to a read latch 120. The I/O gating and data masking circuit 118 supplies N bits of data to the read latch 120, which then applies two N/2 bit words to a multiplexer 122. In the embodiment of FIG. 1, the circuit 118 provides 64 bits to the read latch 120 which, in turn, provides two 32 bits words to the multiplexer 122. A data driver 124 sequentially receives the N/2 bit words from the multiplexer 122 and also receives a data strobe signal DQS from a strobe signal generator 126 and a delayed clock signal CLKDEL from a delay locked loop (ILL) 123. Coupled to the DLL 123 is a DLL control circuit 125. The DLL control circuit 125 receives an auto-refresh activation signal AREF that is generated by the control logic 134, as known in the art. As will explained in more detail below, the DLL control circuit 125 generates a control signal to put the DLL 123 in an idle state in response to the AREF signal, that is, when an auto-refresh operation has been requested.

The DQS signal is used by an external circuit such as a memory controller (not shown) in latching data from the memory device 100 during read operations. In response to the delayed clock signal CLKDEL, the data driver 124 sequentially outputs the received N/2 bits words as a corresponding data word DQ, each data word being output in synchronism with a rising or falling edge of a CLK signal that is applied to clock the memory device 100. The data driver 124 also outputs the data strobe signal DQS having rising and falling edges in synchronism with rising and falling edges of the CLK signal, respectively. Each data word DQ and the data strobe signal DQS collectively define a data bus. As will be appreciated by those skilled in the art, the CLKDEL signal from the DLL 123 is a delayed version of the CLK signal, and the DLL 123 adjusts the delay of the CLKDEL signal relative to the CLK signal to ensure that the DQS signal and the DQ words are placed on the data bus to meet published timing specifications for the memory device 100. The data bus also includes masking signals DM0-M, which will be described in more detail below with reference to data write operations.

During data write operations, an external circuit such as a memory controller (not shown) applies N/2 bit data words DQ, the strobe signal DQS, and corresponding data masking signals DM0-X on the data bus. A data receiver 128 receives each DQ word and the associated DM0-X signals, and applies these signals to input registers 130 that are clocked by the DQS signal. In response to a rising edge of the DQS signal, the input registers 130 latch a first N/2 bit DQ word and the associated DM0-X signals, and in response to a falling edge of the DQS signal the input registers latch the second N/2 bit DQ word and associated DM0-X signals. The input register 130 provides the two latched N/2 bit DQ words as an N-bit word to a write FIFO and driver 132, which clocks the applied DQ word and DM0-X signals into the write FIFO and driver in response to the DQS signal. The DQ word is clocked out of the write FIFO and driver 132 in response to the CLK signal, and is applied to the I/O gating and masking circuit 118. The I/O gating and masking circuit 118 transfers the DQ word to the addressed memory cells in the accessed bank 112A-D subject to the DM0-X signals, which may be used to selectively mask bits or groups of bits in the DQ words (i.e., in the write data) being written to the addressed memory cells.

Figure 2:
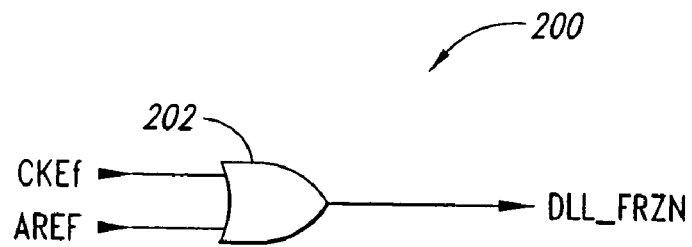
FIG. 2 is a simplified functional block diagram of a delay-locked loop control circuit according to an embodiment of the present invention.

FIG. 2 shows a DLL control circuit 200 according to an embodiment of the present invention. The DLL control circuit 200 can be substituted for the DLL control circuit 125 (FIG. 1). As previously discussed with respect to FIG. 1, the DLL control circuit 200 can be used to put the DLL into an idle state during a memory cell refresh operation, thereby significantly reducing switching currents of the DLL during this time, and consequently, conserving power. The DLL control circuit 200 includes a Boolean OR gate 202 having a complementary clock enable signal CKEf applied to a first input and an auto-refresh activation signal AREF applied to a second input. The output of the OR gate 202 provides a DLL idle signal DLL_FRZN that is used to place the DLL into an idle state.

The CKEf signal is indicative when the internal clock generator has been deactivated. That is, when the CKE signal (FIG. 1) is LOW and the internal clock is deactivated, the CKEf signal is HIGH. Conversely, a LOW CKEf signal is indicative of the clock generator being enabled. As known in the art, the CKE signal is often used to place the memory device into a "power down" state. During this state, the memory device is designed to consume minimal power but maintain the integrity of data stored by the memory cells. Typically, as part of the process of entering the power down state, non-critical circuitry is disabled to eliminate extraneous switching currents within the memory device. In some applications, the output circuitry, including any DLLs, are put into an idle state. As shown in FIG. 2, when the CKEf signal is HIGH, in response to a LOW CKE signal applied to the memory device 100 (FIG. 1), a HIGH DLL_FRZN signal will be generated to idle the DLL 123. In an idle state, the DLL 123 ceases to generate a synchronized output clock signal, but maintains the current setting of its delay line so that when the DLL 123 exits the idle state, the DLL 123 can begin generating a synchronized output clock signal based on the last delay setting of the variable delay line. Although changes in voltages and temperature may cause the synchronization of the output clock signal to drift, the DLL 123 can reacquire lock on the input clock signal much more quickly than if the DLL 123 had been completely reset.

The AREF signal, as previously mentioned, is generated in response to the memory device receiving external command signals for performing an auto-refresh operation. As known in the art, when an auto-refresh command is received by a memory device, memory cells corresponding to an internally generated address are refreshed in a conventional manner. The AREF signal is typically provided to the appropriate circuitry to initiate the auto-refresh operation, and is often used as an internal timing signal for the auto-refresh operation as well. As also known in the art, once the internal refresh operation is initiated, a minimum time is required for the refresh operation to complete before a new command can be initiated.

Figure 3:
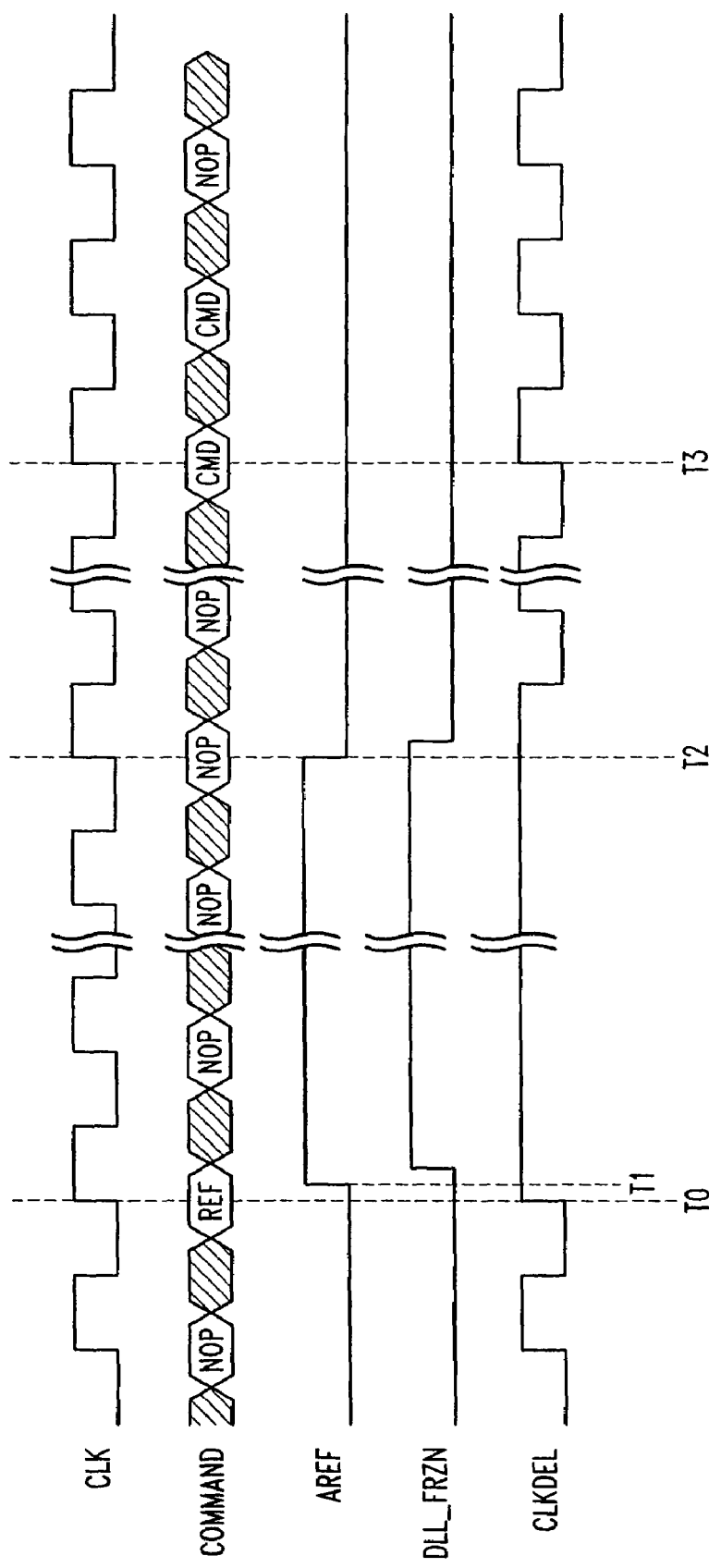
FIG. 3 is a timing diagram of various signals during the operation of an embodiment of the present invention.

In the embodiment of the present invention illustrated in FIG. 2, the AREF signal is additionally provided to the OR gate 202 in order to cause the DLL control circuit 200 to generate an active DLL_FRZN signal and put the DLL 123 into an idle state. As a result, the DLL 123 can be put into an idle state during an auto-refresh operation, as timed by the AREF signal. As previously discussed, a minimum time is required for the refresh operation to complete before a new command can be initiated. In one embodiment, the DLL 123 is taken out of the idle state prior to the expiration of this time to allow for the DLL 123 to adjust for any changes in voltage or temperature before the next command is executed. As illustrated in FIG. 3, and will be explained in more detail below, in such an embodiment, a properly timed AREF signal can be used to time the idle state for the DLL 123. At a time T0, an auto-refresh command REF is latched by the memory device 100. The control logic 834 interprets the auto-refresh command and generates internal signals to initiate the auto-refresh operation. As part of initiating the operation, an active AREF signal is generated by the control logic 134 at a time T1. In response, the DLL control circuit 125 generates an active DLL_FRZN signal that causes the DLL 123 to enter an idle state. As a result, the output clock signal CLKDEL of the DLL 123 ceases to transition between clock states and maintains the last clock state at the time the DLL 123 became idle. At a time T2, the refresh operation has completed internally and the AREF signal becomes inactive. In response, the DLL control circuit 200 generates a LOW DLL_FRZN signal that causes the DLL 123 to exit the idle state and begin generating an output clock signal. The time between T0 and T2 is commonly referred to as tRAS. As previously discussed, the DLL 123 will begin generating an output clock signal using the setting of the variable delay line at the time the DLL 123 became idle. At a time T3, a new command is latched by the memory device, and execution of the command can begin. In the time between T2 and T3, commonly referred to as tRP, the DLL 123 will have time to adjust the variable delay line, if necessary, to accommodate changes that affect the timing of the DLL 123, such as changes in voltage or temperature. Thus, by the time the next memory command CMD is latched at the time T3, the DLL 123 will have adjusted for any synchronization drift, and will provide an output clock signal that is again in synchronicity with the CLK signal.

It will appreciated that by placing the DLL 123 into an idle state for at least a portion of an auto-refresh cycle, the average power consumed by the memory device during the auto-refresh operation can be reduced. Additional power savings is achieved by the fact that output circuitry driven by the synchronous output clock signal of the DLL 123, such as the data drivers 124, will also consume less power because switching currents during the auto-refresh operation will be reduced by the idle DLL 123. In contrast to embodiments of the present invention, typical memory devices leave the full DLL enabled during auto-refresh operations to ensure that the DLL continuously monitors voltage and changes, regardless of the auto-refresh cycle time. As previously discussed, the concern is that the synchronized output clock signal of the DLL will drift excessively unless the DLL constantly monitors and adjusts for changes in operating conditions that affect synchronization. However, in embodiments of the present invention, sufficient time is provided for the DLL 123 following the completion of the auto-refresh operation internally to make any necessary adjustments to changes in the operating condition that will affect the synchronization of the output clock signal before execution of the following memory command begins. The length of time provided to the DLL 123 to adjust is a design choice that is well within the understanding of those ordinarily skilled in the art.

It will be further appreciated that the timing diagram of FIG. 3 has been provided by way of example, and that the particular signals and timing are merely representative of the operation of an embodiment of the present invention. However, the timing diagram should not be interpreted as limiting the scope of the present invention to any particular embodiment described herein.

In the timing diagram of FIG. 3, the auto-refresh command REF at T0 is eventually followed by a memory command CMD at the time T3. It will be appreciated, however, that several auto-refresh commands can be issued to the memory device in sequence to perform a "burst" auto-refresh operation. In the embodiment described with respect to FIGS. 2 and 3, the DLL cycles through entering the idle state and exiting the idle state for every auto-refresh operation. Thus, the DLL will have the opportunity to evaluate any changes affecting synchronization (e.g., changes in voltage and temperature) and make adjustments every auto-refresh cycle to re-synchronize, if necessary. However, in alternative embodiments of the present invention, additional logic circuitry is included in the DLL control circuit 200 (FIG. 2) in order to put the DLL in an idle state every n auto-refresh cycles. In such an embodiment, the DLL is allowed to monitor changes in the operating condition for greater lengths of time for a sequence of auto-refresh operations in comparison to the embodiment discussed with respect to FIG. 3. It may be desirable to have such an embodiment in order to more closely maintain synchronization with the input clock signal.

Figure 4:
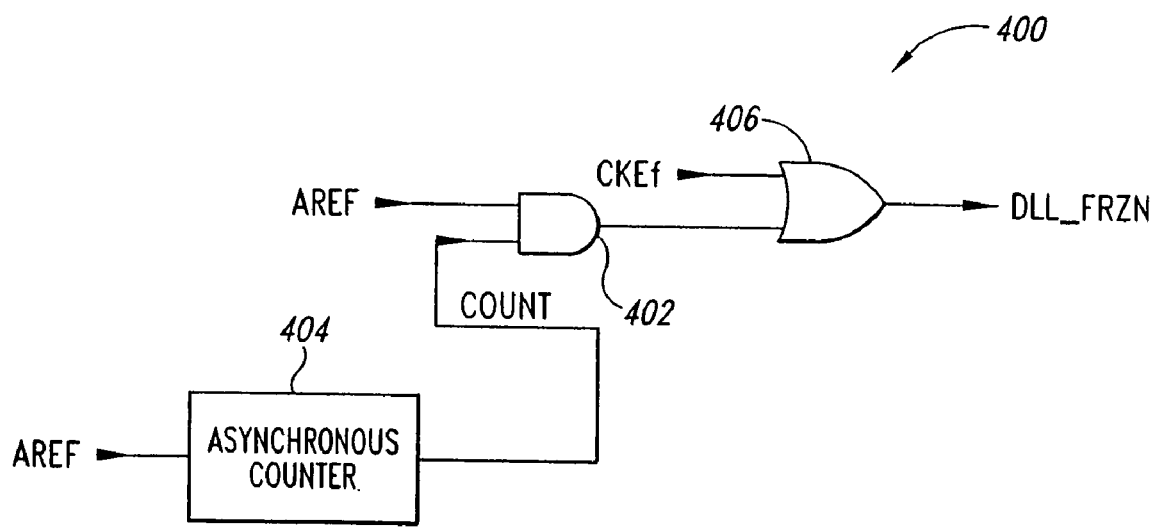
FIG. 4 is a simplified functional block diagram of a delay-locked loop control circuit according to an alternative embodiment of the present invention.

FIG. 4 illustrates a DLL control circuit 123 according to an alternative embodiment of the present invention. The DLL control circuit 123 includes an asynchronous counter circuit 404 having an input to which the AREF signal is applied, and an output from which an output signal is provided to a first input of a Boolean AND gate 202. A second input of the AND gate 202 receives the AREF signal. The AND gate 202 provides an output signal to a first input of a Boolean OR gate 406. A second input of the OR gate receives the CKEf signal. In operation, the asynchronous counter 404 counts the number of cycles of the AREF signal and outputs an active COUNT signal at n−1 cycles of the AREF signal. In response to both the COUNT signal and the AREF signal being HIGH, the OR gate 406 will output an active DLL_FRZN signal. In this manner, the DLL will be put into an idle state once every n cycles of the AREF signal, that is, once for every n auto-refresh operations. The asynchronous counter 404 is of conventional design and operation, and those ordinarily skilled in the art have sufficient understanding to provide a suitable counter circuit.

Figure 5:
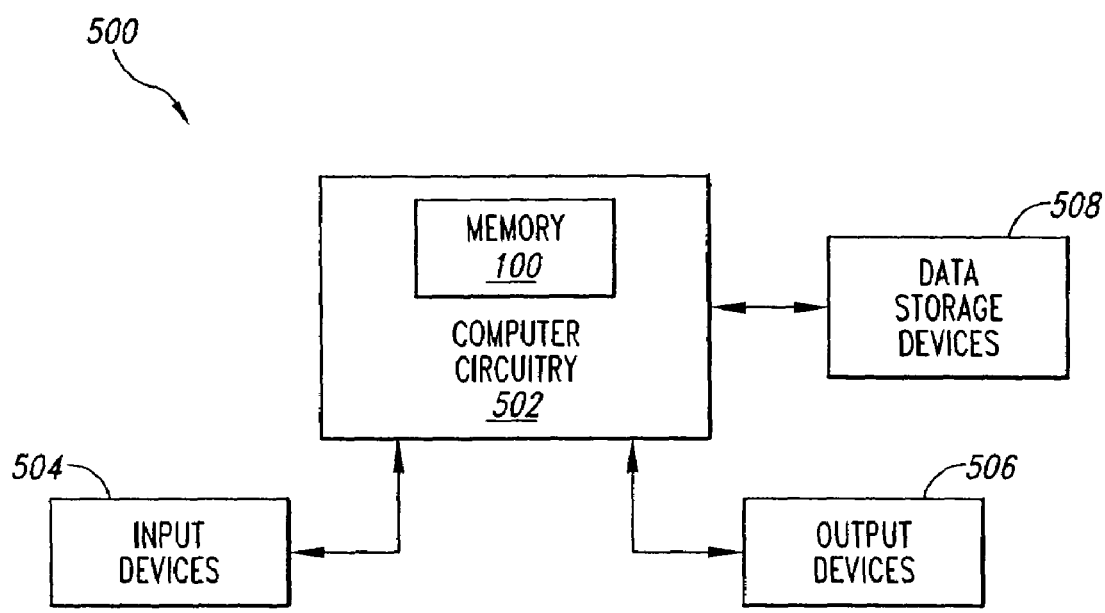
FIG. 5 is a simplified functional block diagram of a processor-based system including the synchronous memory device of FIG. 1.

FIG. 5 is a block diagram of a processor-based system 500 including computer circuitry 502 including the memory device 100 of FIG. 1. Typically, the computer circuitry 502 is coupled through address, data, and control buses to the memory device 100 to provide for writing data to and reading data from the memory device. The computer circuitry 502 includes circuitry for performing various computing functions, such as executing specific software to perform specific calculations or tasks. In addition, the processor-based system 500 includes one or more input devices 504, such as a keyboard or a mouse, coupled to the computer circuitry 502 to allow an operator to interface with the computer system. Typically, the processor-based system 500 also includes one or more output devices 506 coupled to the computer circuitry

502, such as output devices typically including a printer and a video terminal. One or more data storage devices 508 are also typically coupled to the computer circuitry 502 to store data or retrieve data from external storage media (not shown). Examples of typical storage devices 508 include hard and floppy disks, tape cassettes, compact disk read-only (CD-ROMs) and compact disk read-write (CD-RW) memories, and digital video disks (DVDs).

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method of conserving power in a memory device, comprising:
    pausing an operation of a portion of the memory device responsive to at least one of a plurality of control signals having an active value, one of the plurality of control signals a control signal indicative of a refresh operation; and
    resuming the paused operation of the portion of the memory device responsive to each of the plurality of control signals having an inactive value.

2. The method of claim 1, wherein one of the plurality of control signals comprises a control signal having an active value responsive to N occurrences of a triggering event, N being a positive integer greater than 1.

3. The method of claim 1, wherein pausing an operation of a portion of the memory device responsive to at least one of a plurality of control signals having an active value comprises pausing an operation of a portion of the memory device responsive to an at least one of a plurality of control signals having an active value for at least a portion of time during which the at least one of the plurality of control signals has the active value.

4. The method of claim 1, wherein pausing an operation of a portion of the memory device comprises pausing an operation of a clock circuit that is operable to generate an internal clock signal from an external clock signal.

5. A method of conserving power in a memory device during a non-power down state, comprising:
    determining an operation is to be performed;
    temporarily idling a circuitry of the memory device not utilized for the operation for at least a portion of time during which the operation is performed; and
    adjusting timing of the circuitry after it was temporarily idled for changes in timing in the circuitry that occurred when the circuitry was temporarily idled.

6. The method of claim 5, wherein temporarily idling a circuitry of the memory device not utilized for the operation for at least a portion of time during which the operation is performed comprises temporarily idling a circuitry of the memory device not utilized for the operation for at least a portion of time during which an Nth time the operation is performed, N being a positive integer greater than 1.

7. The method of claim 5, wherein the operation comprises a refresh operation.

8. The method of claim 5, wherein the circuitry comprises a synchronizing clock circuit operable to generate an internal clock signal timed with respect to an external clock signal.

9. A method of conserving power in a memory device, comprising:
    pausing an operation of a portion of the memory device responsive to at least one of a plurality of control signals having an active value, one of the plurality of control signals a control signal having an active value responsive to N occurrences of a triggering event, N being a positive integer greater than 1; and
    resuming the paused operation of the portion of the memory device responsive to each of the plurality of control signals having an inactive value.

10. The method of claim 9, wherein one of the plurality of control signals comprises a control signal indicative of a refresh operation.

11. The method of claim 9, wherein one of the plurality of control signals comprises a control signal having an active value responsive to N occurrences of a triggering event, N being a positive integer greater than 1.

12. The method of claim 9, wherein pausing an operation of a portion of the memory device responsive to at least one of a plurality of control signals having an active value comprises pausing an operation of a portion of the memory device responsive to an at least one of a plurality of control signals having an active value for at least a portion of time during which the at least one of the plurality of control signals has the active value.

13. The method of claim 9, wherein pausing an operation of a portion of the memory device comprises pausing an operation of a clock circuit that is operable to generate an internal clock signal from an external clock signal.

14. A method of conserving power in a memory device during a non-power down state, comprising:
    determining a refresh operation is to be performed; and
    temporarily idling a circuitry of the memory device not utilized for the operation for at least a portion of time during which the operation is performed.

15. The method of claim 14, wherein temporarily idling a circuitry of the memory device not utilized for the operation for at least a portion of time during which the operation is performed comprises temporarily idling a circuitry of the memory device not utilized for the operation for at least a portion of time during which an Nth time the operation is performed, N being a positive integer greater than 1.

16. The method of claim 14, wherein the circuitry comprises a synchronizing clock circuit operable to generate an internal clock signal timed with respect to an external clock signal.

17. The method of claim 14, further comprising adjusting timing of the circuitry after it was temporarily idled for changes in timing in the circuitry that occurred when the circuitry was temporarily idled.

* * * * *

UNITED STATES PATENT AND TRADEMARK OFFICE
CERTIFICATE OF CORRECTION

PATENT NO. : 7,606,101 B2
APPLICATION NO. : 11/506238
DATED : October 20, 2009
INVENTOR(S) : Schoenfeld et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 441 days.

Signed and Sealed this

Fifth Day of October, 2010

David J. Kappos
*Director of the United States Patent and Trademark Office*